(12) United States Patent
Hartmann

(10) Patent No.: US 6,774,649 B2
(45) Date of Patent: Aug. 10, 2004

(54) TEST SYSTEM FOR CONDUCTING A FUNCTION TEST OF A SEMICONDUCTOR ELEMENT ON A WAFER, AND OPERATING METHOD

(75) Inventor: Udo Hartmann, München (DE)

(73) Assignee: Infineon Technologies AG, Munich (DE)

( * ) Notice: Subject to any disclaimer, the term of this patent is extended or adjusted under 35 U.S.C. 154(b) by 59 days.

(21) Appl. No.: 10/076,977

(22) Filed: Feb. 15, 2002

(65) Prior Publication Data

US 2002/0109524 A1 Aug. 15, 2002

(30) Foreign Application Priority Data

Feb. 15, 2001 (DE) .......................................... 101 07 180

(51) Int. Cl.⁷ ............................................. G01R 31/02
(52) U.S. Cl. ...................................... 324/754; 324/761
(58) Field of Search .............................. 324/754, 761, 324/158.1, 765

(56) References Cited

U.S. PATENT DOCUMENTS

| | | | | |
|---|---|---|---|---|
| 4,023,097 A | * | 5/1977 | Hanashey .................. 327/100 |
| 5,101,153 A | * | 3/1992 | Morong, III ................ 324/537 |
| 5,467,024 A | * | 11/1995 | Swapp ........................ 324/771 |
| 5,917,331 A |  | 6/1999 | Persons ...................... 324/765 |
| 6,275,023 B1 | * | 8/2001 | Oosaki et al. ........... 324/158.1 |

FOREIGN PATENT DOCUMENTS

DE      84 31 718.3      4/1986

* cited by examiner

*Primary Examiner*—Evan Pert
*Assistant Examiner*—Paresh Patel
(74) *Attorney, Agent, or Firm*—Laurence A. Greenberg; Werner H. Stemer; Ralph E. Locher

(57) ABSTRACT

A test system for conducting a function test of a semiconductor element on a wafer and a method for conducting the test includes a voltage source providing a supply voltage of the element being tested, two supply contact pins connected to the voltage source for applying the supply voltage to terminal pads of the element being tested, a read contact pin producing a currentless electrical read connection of the test system to a terminal pad of the element being tested, and a means for regulating the output voltage delivered by the voltage source based upon the electrical potential of the read contact pin. As such, the supply voltage of the semiconductor element can be adjusted more precisely in the function test.

8 Claims, 1 Drawing Sheet

US 6,774,649 B2

TEST SYSTEM FOR CONDUCTING A FUNCTION TEST OF A SEMICONDUCTOR ELEMENT ON A WAFER, AND OPERATING METHOD

BACKGROUND OF THE INVENTION

Field of the Invention

The invention relates to a test system for conducting a function test of a semiconductor element on a wafer, including a voltage source providing a supply voltage of the semiconductor element that is being tested and two supply contact pins that are connected to the voltage source for applying the supply voltage to terminal pads of the element being tested.

New generations of semiconductor elements, particularly semiconductor memories, operate at clock frequencies well above 200 MHz. The yield of operational elements can be increased, and the cost of the tests for packaged modules can be lowered, by performing the required tests of module performance reliability as far as possible on the wafer plane.

In the test on the wafer plane, a pin card produces the connection between the test system and the element. The majority of the contact pins serve for transferring the high-speed test signals from the test system to the module being tested. Additional contact pins that are connected to the voltage source conduct one or more supply voltages, for instance, with a level of 3.3 V or 2.5 V, to corresponding terminal pads of the semiconductor module.

Another technique is to provide a current-free read line (sense) that is connected on the pin card to one of the voltage supply lines (force) driving the current. By determining the potential difference between the voltage source and the measuring point (the intersection of the force line and the sense line), it is possible to compensate the voltage drop along the feeders from the voltage source to the pin card by way of the read head, various connectors, and the motherboard.

The problem associated with such a configuration is that the precision with which the supply voltage can be provided at the terminal pads of the semiconductor element is dependent on the condition of the pin card. Given an equal output voltage of the voltage source on the semiconductor chip, a pin card with freshly cleaned pins provides a higher voltage than a pin card on whose pins aluminum or other impurities have collected due to long-term use.

Because the level of the voltage supply of semiconductor elements likewise decreases with increasing miniaturization, the importance of such variations of the supply voltage is growing.

U.S. Pat. No. 5,917,331 to Persons describes a test system for conducting function testing of semiconductor modules wherein a voltage source provides a supply voltage of the module being tested, a supply line applies the voltage to the module, and a sense line derives a read signal from the voltage supply pins of the module in order to correct voltage drops in the supply line.

The German Utility Model DE 8431718 U1 discloses a double contact point having two separated and electrically isolated points for measuring potential according to the 4-point method in integrated electronic circuits.

SUMMARY OF THE INVENTION

It is accordingly an object of the invention to provide a test system for conducting a function test of a semiconductor element on a wafer, and operating method that overcomes the aforementioned disadvantages of the heretofore-known devices and methods of this general type and that increases the precision with which a supply voltage can be applied to corresponding terminal pads of the element being tested.

With the foregoing and other objects in view, there is provided, in accordance with the invention, a test system for conducting a function test of a semiconductor element on a wafer, the element having terminal pads, the test system including a voltage source delivering an output voltage and providing a supply voltage of the element being tested, a pin card having supply contact pins, a resistance, and a read contact pin connected to one of the supply contact pins through the resistance producing a high-impedance electrical read connection to a terminal pad of the element being tested, and a regulator controlling the output voltage based upon an electrical potential of the read contact pin. The supply contact pins include two supply contact pins each connected to the voltage source for applying the supply voltage to the terminal pads of the element being tested.

Besides the supply contact pins, the inventive test system includes a read contact pin for producing a currentless electrical read connection of the test system to a terminal pad of the element being tested.

Also provided is a regulating device or means for regulating the output voltage that is delivered by the voltage source based upon the electrical potential of the read contact pin.

The invention is, thus, based on the idea of extending a read line through a read contact pin to a terminal pad of the module being tested. By regulating the output voltage delivered by the voltage source based upon the electrical potential of the read contact pin, it is possible to adjust the supply voltage to the desired value notwithstanding a transitional resistance between the supply contact pin and the terminal pad.

Such adjustment can be accomplished in that there is, contacted to the read contact pin, a terminal pad of the structural element that is electrically connected to the terminal pad that is contacted by the supply contact pin conducting the potential.

What is meant by a currentless read connection of the test system to a terminal pad of the element being tested is a connection whereby a small enough measuring current is impressed for purposes of potential determination that voltage drops along the read line have no measurable impact on the result.

The potential difference between the read contact pin and the supply contact pin conducting ground thus indicates the supply voltage actually present at the corresponding terminals of the structural element so that the output voltage of the voltage source can be readjusted according to the deviation from the desired supply voltage.

According to the conventional procedure wherein the read line is connected to a supply line on the pin card, the voltage drop between the pin card and the module being tested is not taken into account. It has been discovered that this value is on the order of 50 mV in practice for memory module testing.

Moreover, the transitional resistance between the supply contact pins and the terminal pads of the semiconductor element is determined substantially by the condition of the pins, particularly, the level of contamination of the pins and the length of time since the pin card was last cleaned. With the inventively provided read contact pin, the dependency of the applied supply voltage on the transitional resistance between the supply pins and the terminal pad is eliminated, and, with it, the dependency on the condition of the pin card.

The supply voltage for the semiconductor element thus can be more precisely adjusted. The additional precision becomes more important with increasing miniaturization of the structural element.

The current drawn by the modules also remains approximately constant given a dropping supply voltage Vcc, so that the voltage drop due to a transitional resistance between the supply pins and the terminal pad remains approximately the same. However, due to the dropping absolute value of the supply voltage, the error percentage generated by the voltage drop increases accordingly.

Another advantage derives from the observation that the power consumption of a chip during the test operation depends on the operating frequency. For instance, in the test if the function of a structural element is first tested at a low operating frequency and then at a higher operating frequency given a successful low-frequency test, the power consumption of the element rises. If the supply voltage is delivered by a prior art test system in a conventional manner, the voltage drop at the transitional resistance, and, with it, the supply voltage at the chip, also vary with the power consumption. With the inventive regulating of the output voltage through the read contact pin, the influence of the transitional resistance is eliminated, and, with it, the described dependency.

In accordance with another feature of the invention, the test system includes a second read contact pin for the currentless electrical read connection of the test system to a terminal pad of the element being tested. The output voltage delivered by the voltage source is then regulated in dependence upon both the potential of the first read contact pin and the potential of the second read contact pin. As such, it is possible to compensate transitional resistances and, thus, voltage drops both in the supply line conducting the potential and in the supply line conducting ground. In turn, the currentless read connection makes possible an uncorrupted determination of the potential.

In accordance with a further feature of the invention, the supply contact pins and the one or two read contact pins are disposed on a pin card.

In such a case, the first read contact pin on the pin card is connected to one of the supply contact pins, preferably, the supply contact pin conducting the potential, by way of a resistance. As such, in the event of a bad contact or a missing contact of the read contact pin on the module being tested, it is still possible to perform a correction of all voltage drops occurring between the voltage source and the pin card, though no longer of the voltage drop due to the transitional resistance.

In accordance with an added feature of the invention, there is provided a second resistance and the second read contact pin is connected to another of the supply contact pins through the second resistance.

If a second read contact pin is provided, the second pin is expediently connected on the pin card to the other supply contact pin, preferably, the one conducting ground, by way of a resistance.

With the objects of the invention in view, there is also provided a method for conducting, with a test system, a function test of a semiconductor element on a wafer, including the steps of defining a desired supply voltage of the semiconductor element, applying a supply voltage from a voltage source through two supply contact pins of a pin card to corresponding terminal pads of the element being tested, producing a high-impedance electrical read connection to a terminal pad of the element being tested by connecting a supply contact pin to a read contact pin of the pin card through a resistance, determining a potential of the read contact pin relative to a reference potential, and regulating an output voltage of the voltage source dependent upon the determined potential of the read contact pin to achieve an approximation of the desired supply voltage.

With the objects of the invention in view, there is also provided a method for conducting, with a test system, a function test of a semiconductor element on a wafer, including the steps of defining a desired supply voltage of the semiconductor element, applying a supply voltage from a voltage source through two supply contact pins of a pin card to corresponding terminal pads of the element being tested, producing a high-impedance electrical read connection to terminal pads of the element being tested by respectively connecting first and second supply contact pins to first and second read contact pins of the pin card through a respective resistance, determining a potential of the first and second read contact pins relative to a reference potential, and regulating the output voltage of the voltage source dependent upon the determined potentials to achieve an approximation of the desired supply voltage.

Other features that are considered as characteristic for the invention are set forth in the appended claims.

Although the invention is illustrated and described herein as embodied in a test system for conducting a function test of a semiconductor element on a wafer, and operating method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
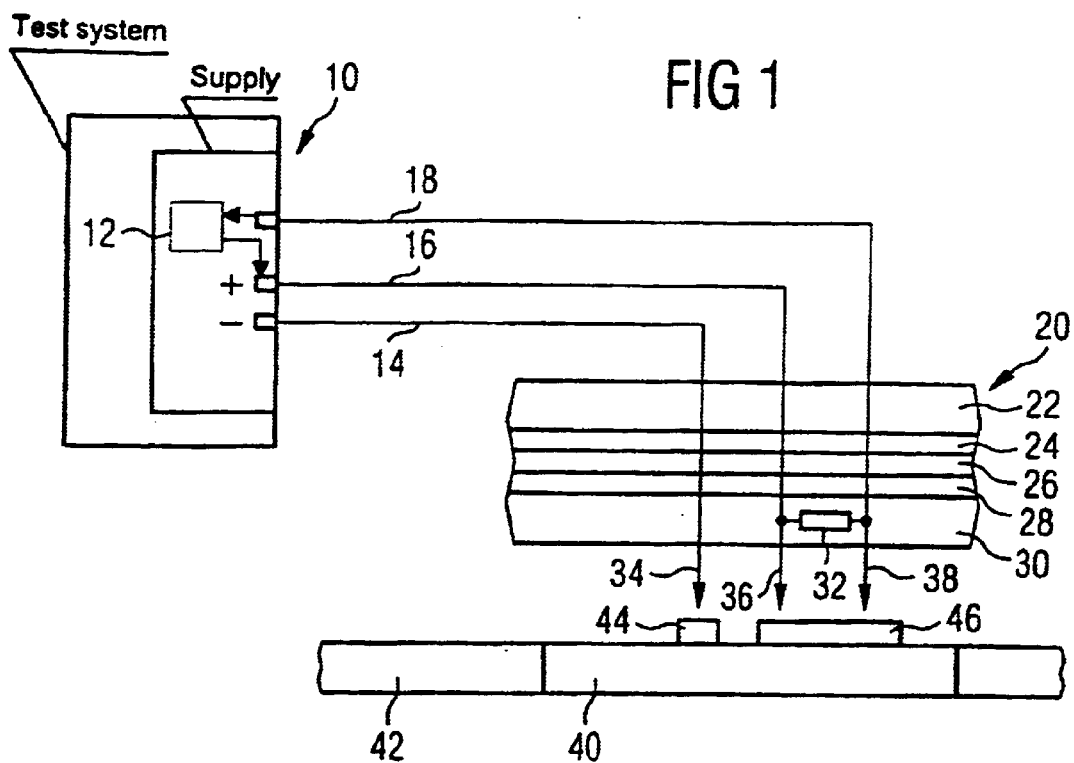
FIG. 1 is a fragmentary, schematic and block circuit diagram of a test system according to the invention.

Referring now to the figures of the drawings in detail and first, particularly to FIG. 1 thereof, there is shown a test system 10, which, in addition to devices for generating and emitting test signals not included in the figure, also includes a programmable voltage supply 12. Located on a wafer 42 is a memory module 40 that is being tested. The memory module 40 includes a terminal pad 44 for the ground terminal and a terminal pad 46 for the positive supply voltage Vcc, among other components. The terminal pad 46 is large enough to accommodate two adjacent contact pins.

The supply voltage is provided by the programmable voltage source 12 and conducted to the corresponding terminal pads 44, 46 by way of current drive lines 14, 16. The lines 14, 16 lead to a pin card configuration 20, which includes a test head 22, connector 24, motherboard 26, pogo pins 28, and a pin card board 30. The individual elements of the pin card configuration 20 are represented in FIG. 1 only schematically.

In the test operation, an electrical connection is produced between the pin card configuration 20 and the module 40 being tested by way of the contact pins 34, 36, 38. The first supply contact pin 34 connects the ground output of the voltage source 12 to the terminal pad 44, and the second supply contact pin 36 connects the positive pole of the supply voltage to the corresponding terminal pad 46.

A read line 18 and an appertaining read contact pin 38 are also provided, to which the terminal pad 46 is likewise contacted in the test operation. Through the read contact pin 38 and the read line 18, the potential of the terminal pad 46 relative to ground is determined practically without current.

If the measured potential deviates from the desired supply voltage, 3.3 V in the exemplifying embodiment, the programmable voltage source 12 readjusts the output voltage in accordance with the deviation. In the adjusted state, precisely the desired supply voltage is present between the terminal pads 44 and 46 on the module being tested, and all voltage drops that occur on the pin card configuration components 22–30, as well as a transitional resistance between the supply pins 34, 36 and the corresponding terminal pads 44, 46, are compensated.

As such, the voltage supply for the chip can be set substantially more precisely. Variable transitional resistances, for instance, due to a changing level of contact pin contamination over time, are eliminated.

On the pin card board 30, the positive supply voltage line 16 and the read line 18, that is to say, the supply contact pin 36 and the read pin 38, are connected to each other by way of a resistance 32.

Such a configuration guarantees that at least the voltage drops at the components of the pin card configuration 20 can be compensated even in the event of a bad or missing contact of the read contact pin 38 on the chip. In the exemplifying embodiment, given an input resistance of the voltage source 12 of 10 MOhm, the resistance 32 has a value of approximately 10 kOhm, which guarantees sufficient measurement accuracy given the expected transitional resistances of some 10 Ohms between the contact pins and terminal pads.

In a second embodiment (FIG. 2) a read line 19 and an appertaining second read contact pin 39 are also provided for the ground line 14.

With such an embodiment it is also possible to compensate voltage drops along the ground line. In case of missing or bad contacts of the read contact pin 39, resistance 33 is interposed between the negative supply voltage line 14 and the read line 19 on the pin card board 30.

Figure 2:
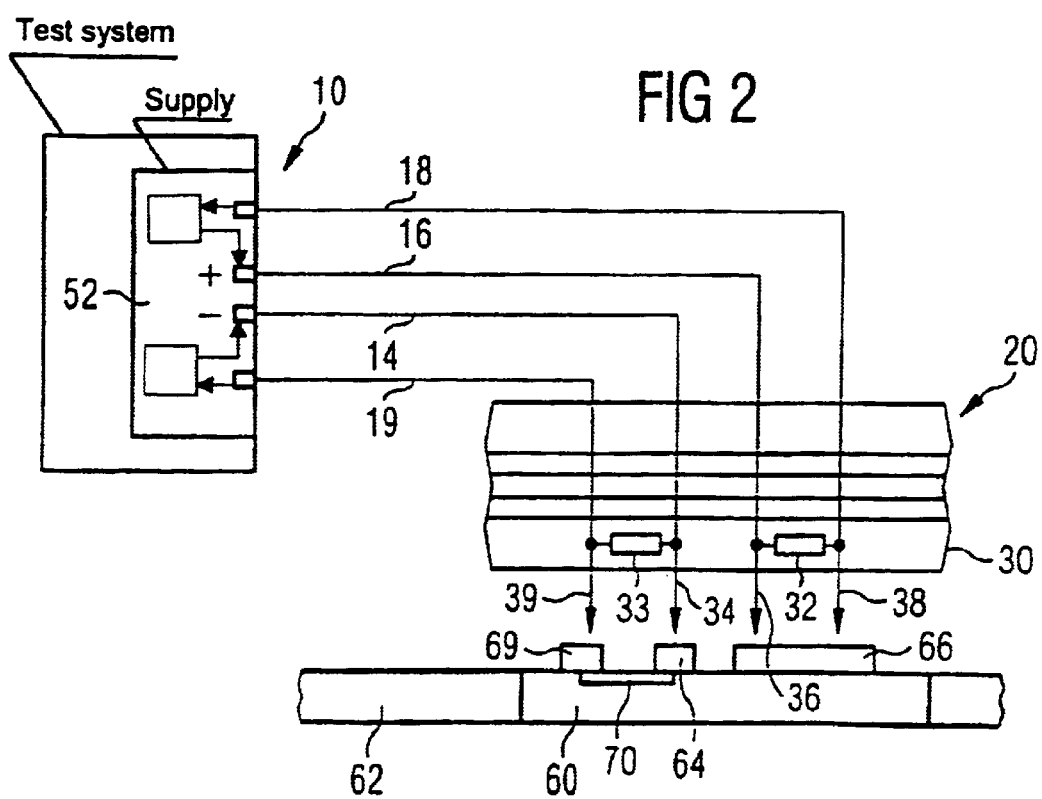
FIG. 2 is a fragmentary, schematic and block circuit diagram of an alternative embodiment of the test system of FIG. 1.

In the representation in FIG. 2, the module 60 being tested, which is disposed on the wafer 62, includes a terminal pad 66 for the positive supply voltage that is large enough to accommodate two adjacent contact pins 36, 38. For the negative supply voltage (ground), for purposes of illustration two separate terminal pads 64, 69 are represented for the respective contact pins 34, 39 on the chip, these being electrically connected by a conductive connection 70.

In this embodiment as well, the currentless determination of the potential values with the aid of the read lines 18, 19 makes possible a precise adjustment of the supply voltage by way of a corresponding readjustment of the output voltage of the programmable voltage source 52.

I claim:

1. A test system for conducting a function test of a semiconductor element on a wafer, the semiconductor element having terminal pads, the test system comprising:
a voltage source delivering an output voltage and providing a supply voltage of the element being tested;
a pin card having:
a pin card board;
supply contact pins arranged on said pin card board including one of said supply contact pins and another one of said supply contact pins;
a resistance disposed on said pin card board;
a read contact pin disposed on said pin card board and connected to said one of said supply contact pins through said resistance;
said one of said supply contact pins and said read contact pin being configured to contact one of said terminal pads of the element being tested;
said other one of said supply contact pins being configured to contact another one of said terminal pads of the element being tested;
said read contact pin producing a high-impedance electrical read connection to said one of said terminal pads of the element being tested;
said one of said supply contact pins and said other one of said supply contact pins each connected to the voltage source for applying the supply voltage to said one of said terminal pads and said other one of said terminal pads of the semiconductor element being tested; and
a regulator controlling the output voltage based upon an electrical potential of said read contact pin.

2. The test system according to claim 1, wherein:
said pin card has a second read contact pin producing a high-impedance electrical read connection to another of the terminal pads of the element being tested; and
said regulator controlling the output voltage based upon an electrical potential of said read contact pin and an electrical potential of said second read contact pin.

3. The test system according to claim 2, including a second resistance, said second read contact pin connected to another of said supply contact pins through said second resistance.

4. A test system for conducting a function test of a semiconductor element on a wafer, the semiconductor element having terminal pads, the test system comprising:
a voltage source delivering an output voltage and providing a supply voltage of the element being tested;
a pin card having:
a pin card board;
supply contact pins arranged on said pin card board including one of said supply contact pins and another one of said supply contact pins;
a resistance disposed on said pin card board;
a read contact pin disposed on said pin card board and connected to said one of said supply contact pins through said resistance;
said one of said supply contact pins and said read contact pin being configured to contact one of said terminal pads of the element being tested;
said other one of said supply contact pins being configured to contact another one of said terminal pads of the element being tested;
said read contact pin producing a high-impedance electrical read connection to said one of said terminal pads of the element being tested;
said one of said supply contact pins and said other one of said supply contact pins each connected to the voltage source for applying the supply voltage to said one of said terminal pads and said other one of said terminal pads of said element being tested; and
means for regulating the output voltage based upon an electrical potential of said read contact pin.

5. The test system according to claim 4, wherein:

said pin card has a second read contact pin producing a high-impedance electrical read connection to another of the terminal pads of the element being tested; and said regulating means regulates the output voltage based upon an electrical potential of said read contact pin and an electrical potential of said second read contact pin.

6. The test system according to claim 5, including a second resistance, said second read contact pin connected to another of said supply contact pins through said second resistance.

7. A method for conducting, with a test system, a function test of a semiconductor element on a wafer, which comprises:

defining a desired supply voltage of the semiconductor element;

applying a supply voltage from a voltage source through two supply contact pins of a pin card to corresponding terminal pads of the element being tested;

producing a high-impedance electrical read connection to a terminal pad of the element being tested by connecting a supply contact pin to a read contact pin of the pin card through a resistance;

determining a potential of the read contact pin relative to a reference potential; and regulating an output voltage of the voltage source dependent upon the determined potential of the read contact pin to achieve an approximation of the desired supply voltage.

8. A method for conducting, with a test system, a function test of a semiconductor element on a wafer, which comprises:

defining a desired supply voltage of the semiconductor element;

applying a supply voltage from a voltage source through two supply contact pins of a pin card to corresponding terminal pads of the element being tested;

producing a high-impedance electrical read connection to terminal pads of the element being tested by respectively connecting first and second supply contact pins to first and second read contact pins of the pin card through a respective resistance;

determining a potential of the first and second read contact pins relative to a reference potential; and regulating the output voltage of the voltage source dependent upon the determined potentials to achieve an approximation of the desired supply voltage.

* * * * *